US012725673B2

(12) United States Patent
Zhang et al.

(10) Patent No.: US 12,725,673 B2
(45) Date of Patent: Sep. 1, 2026

(54) PROACTIVE HISTORY READ ADAPTATION WITHOUT TEST READ

(71) Applicant: SK hynix Inc., Gyeonggi-do (KR)

(72) Inventors: Fan Zhang, San Jose, CA (US); Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 99 days.

(21) Appl. No.: 18/811,652

(22) Filed: Aug. 21, 2024

(65) Prior Publication Data

US 2026/0057953 A1 Feb. 26, 2026

(51) Int. Cl.
*G11C 29/12* (2006.01)
*G11C 29/46* (2006.01)

(52) U.S. Cl.
CPC .... *G11C 29/1201* (2013.01); *G11C 29/12015* (2013.01); *G11C 29/46* (2013.01)

(58) Field of Classification Search
CPC .......... G11C 29/1201; G11C 29/12015; G11C 29/46
See application file for complete search history.

(56) References Cited

U.S. PATENT DOCUMENTS 9,697,905 B2 * 7/2017 Sharon .................. G11C 29/04
11,386,972 B2 * 7/2022 Li .......................... G11C 11/54
2023/0019347 A1 1/2023 Choi et al.
2023/0071837 A1 3/2023 Karakulak et al.

* cited by examiner

*Primary Examiner* — Xiaochun L Chen
(74) *Attorney, Agent, or Firm* — IP & T GROUP LLP

(57) ABSTRACT

A method and associated memory system for reading data from memory. The method and memory system perform read operations on the memory while recording as read retry (RR) biases a set of history entries of voltages used to read the memory; select from the set of history entries the RR biases for subsequent read operation of the memory without performing a test operation with any of the RR biases before the subsequent read operations; in the subsequent read operations, read the memory with one or more of the RR biases from the history entries; when a failed bit count is higher than a threshold for the subsequent read operations, evict a worst entry from the history entries and introduce a new history entry into the set of history entries; and update the RR biases based on the new history entry.

20 Claims, 13 Drawing Sheets

FIG. 7

Gen6 QoS SOL requirement

QoS Req. in GR ARD Rev 0.42, 0.54

4K QD1 (best in class for TLC, @25W slot power):

- Average: <50us
- 99%: <62us
- 99.9%: <63us
- 99.99%: <66us
- 99.999%:: <81us
- 99.9999%: <103us Gen6 QoS EOL requirement
Device shall not exceed the following latency requirements:

| | | 4KiB (μs) | 8KiB (μs) | 64KiB (μs) | Operations Needed in Test* |
|---|---|---|---|---|---|
| Average | | 240 | 250 | 450 | -- |
| 99 % | (2 nines) | 300 | 360 | 770 | >100 |
| 99.9 % | (3 nines) | 500 | 650 | 1,200 | >1,000 |
| 99.99 % | (4 nines) | 900 | 1,000 | 2,000 | >10,000 |
| 99.999 % | (5 nines) | 1,200 | 2,000 | 3,500 | >1e5 |
| Maximum Timeout | | 8 seconds | 8 seconds | 8 seconds | -- |

Gen6 QoS Requirement at SOL and EOL

PROACTIVE HISTORY READ ADAPTATION WITHOUT TEST READ

BACKGROUND

1. Field

The present invention relates to the reading of data from a solid-state drive (SSD) memory device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated. The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

In this context, embodiments of the present invention arise.

SUMMARY

In accordance with one embodiment of the invention, there is provided a method for reading data from memory. The method performs read operations on the memory while recording as read retry (RR) biases a set of history entries of voltages used to read the memory; selects from the set of history entries the RR biases for subsequent read operation of the memory without performing a test operation with any of the RR biases before the subsequent read operations; in the subsequent read operations, reads the memory with one or more of the RR biases from the history entries; when a failed bit count is higher than a threshold for the subsequent read operations, evicts a worst entry from the history entries and introduces a new history entry into the set of history entries; and updates the RR biases based on the new history entry.

In accordance with another embodiment of the invention, there is provided a memory system comprising a memory and a controller configured to read data from memory. The controller is configured to perform read operations on the memory while recording as read retry (RR) biases a set of history entries of voltages used to read the memory; select from the set of history entries the RR biases for subsequent read operation of the memory without performing a test operation with any of the RR biases before the subsequent read operations; in the subsequent read operations, read the memory with one or more of the RR biases from the history entries; when a failed bit count is higher than a threshold for the subsequent read operations, evict a worst entry from the history entries and introduce a new history entry into the set of history entries; and update the RR biases based on the new history entry.

BRIEF DESCRIPTION OF THE DRAWINGS

FIG. 7 is a diagram illustrating contemporaneous Quality of Service requirements for solid state drives.

DETAILED DESCRIPTION

Figure 1:
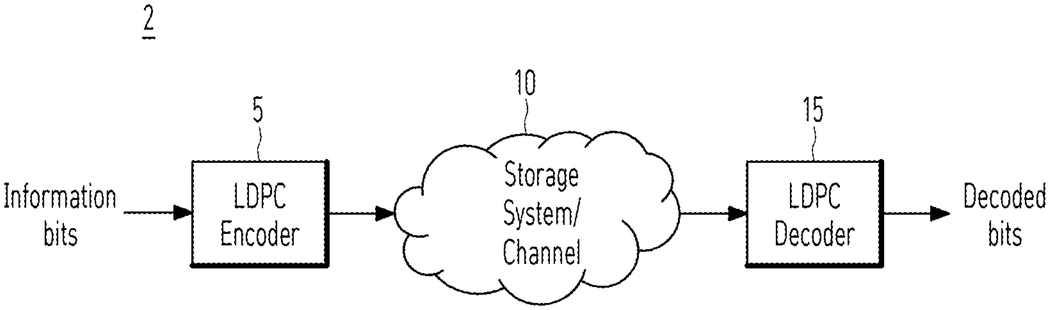
FIG. 1 is a high level block diagram illustrating an error correcting system in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention encompasses numerous alternatives, modifications and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

FIG. 1 is a high-level block diagram illustrating an error correcting system 2, in accordance with embodiments of the present invention. More specifically, the high-level block diagram in FIG. 1 shows error correcting system 2 including an encoder 5 and a decoder 15 using for example LDPC coding and decoding algorithms. That is, error correcting system 2 may include a LDPC encoder 5 and a LDPC decoder 15, although other coding and decoding algorithms can be used.

Figure 2:
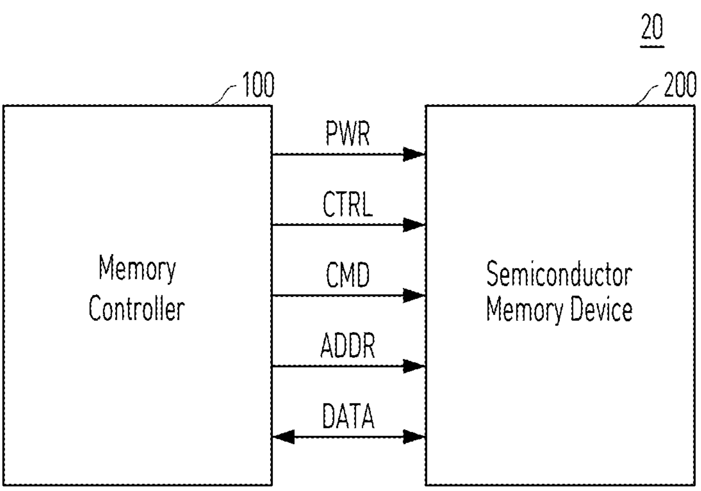
FIG. 2 is a block diagram schematically illustrating a memory system in accordance with embodiments of the present invention.

The LDPC encoder 5 may receive information bits including data which is desired to be stored in a storage system 10 (such as in memory system 20 of FIG. 2). The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

FIG. 2 is a block diagram schematically illustrating a memory system 20 in accordance with an embodiment of the present invention.

Referring FIG. 2, the memory system 20 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as an SSD. The solid state drive may include a storage device for storing data therein. When the semiconductor memory system 20 is used in an SSD, operation speed of a host (not shown) coupled to the memory system 20 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 20 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 3:
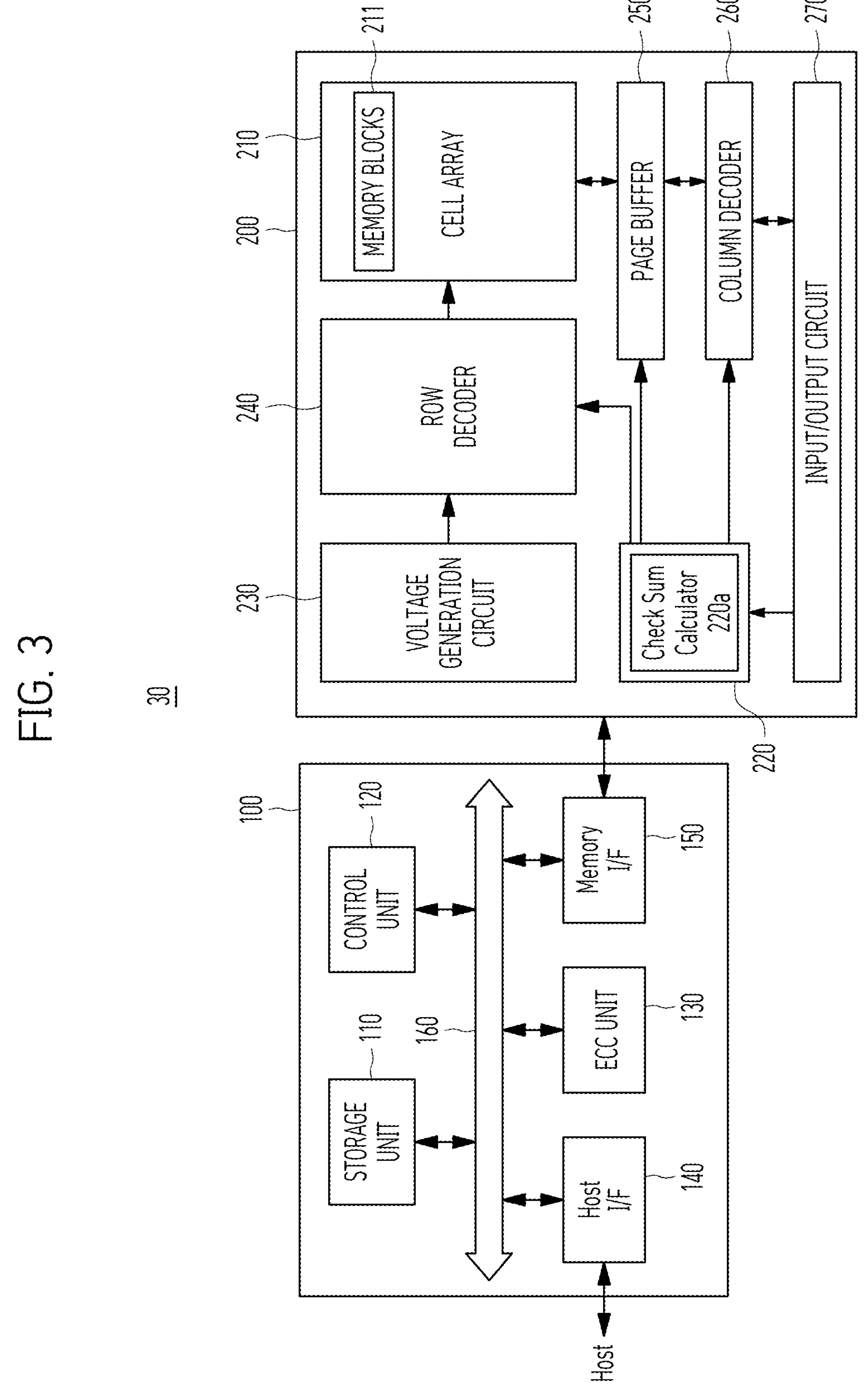
FIG. 3 is a block diagram illustrating a memory system in accordance with embodiments of the present invention.

FIG. 3 is a detailed block diagram illustrating various embodiments of memory system 30 in accordance with one embodiment of the present invention. For example, memory system 30 of FIG. 3 may depict the storage system 10 shown in FIG. 1 or the memory system 20 shown in FIG. 2.

Referring to FIG. 3, the memory system 30 may include the memory controller 100 and the semiconductor memory device 200. The memory system 30 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host. The controller 100 may provide the data read from the memory device 200, to the host, and store the data provided from the host into the memory device 200.

The controller 100 may include a storage unit 110, a control unit 120, the error correction code (ECC) unit 130, a host interface (I/F) 140 and a memory interface (I/F) 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

Referring to FIG. 3, the control unit 120 may control general operations of the memory system 30, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as an LDPC code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

As shown in FIG. 3, host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control unit (e.g., CPU) 120. When the memory device 200 is a flash memory such as a NAND flash memory, the memory interface 150 may generate control signals for the memory and process data under the control of the control unit 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The control circuit 220 includes in one embodiment of the present invention checksum calculator module 220*a* (described in more detail below). The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4A:
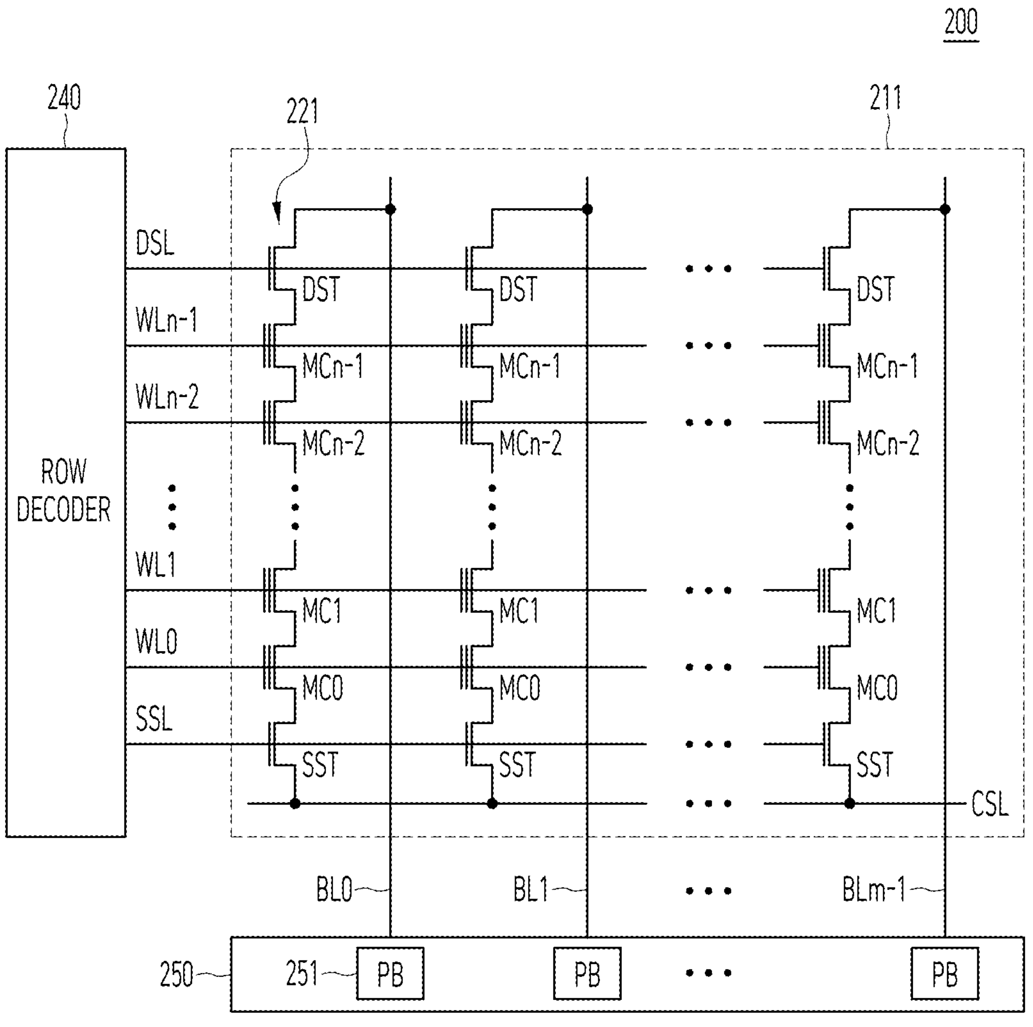
FIG. 4A is a circuit diagram illustrating a memory block of a memory device in accordance with embodiments of the present invention.

FIG. 4A is a circuit diagram illustrating a memory block of a semiconductor memory device in accordance with an embodiment of the present invention. For example, a memory block of FIG. 4A may be the memory blocks 211 of the memory cell array 210 shown in FIG. 3.

Referring to FIG. 4A, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Referring back to FIGS. 3 and 4A, the memory device 200 may include a plurality of memory cells (e.g., NAND flash memory cells). The memory cells are arranged in an array of rows and columns as shown in FIG. 4A. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with triple-level cells (TLCs), the multiple pages include an MSB page, a center significant bit (CSB) page and an LSB page. When the memory cells are implemented with quadruple level cell (QLCs), the multiple pages include an MSB page, a center most significant bit (CMSB) page, a center least significant bit (CLSB) page and an LSB page. The memory cells may be programmed for example using a coding scheme (e.g., Gray coding) in order to increase the capacity of the memory system 10 such as SSD.

Figure 4B:
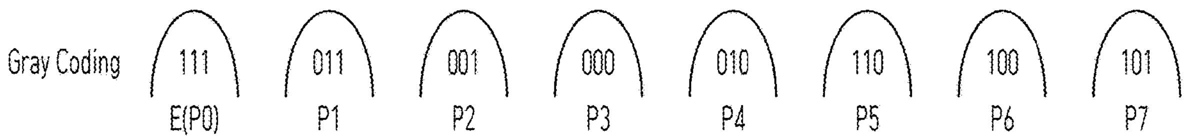
FIG. 4B is a diagram illustrating one example of Gray coding for a triple-level cell (TLC) in accordance with another embodiment of the present invention.

FIG. 4B is a diagram illustrating an example of Gray coding for a triple-level cell (TLC).

Referring to FIG. 4B, a TLC may be programmed using Gray coding. A TLC may have 8 program states, which include an erased state E (or P0) and a first program state P1 to a seventh program state P7. The erased state E (or P0) may correspond to "111." The first program state P1 may correspond to "011." The second program state P2 may correspond to "001." The third program state P3 may correspond to "000." The fourth program state P4 may correspond to "010." The fifth program state P5 may correspond to "110." The sixth program state P6 may correspond to "100." The seventh program state P7 may correspond to "101."

Figure 4C:
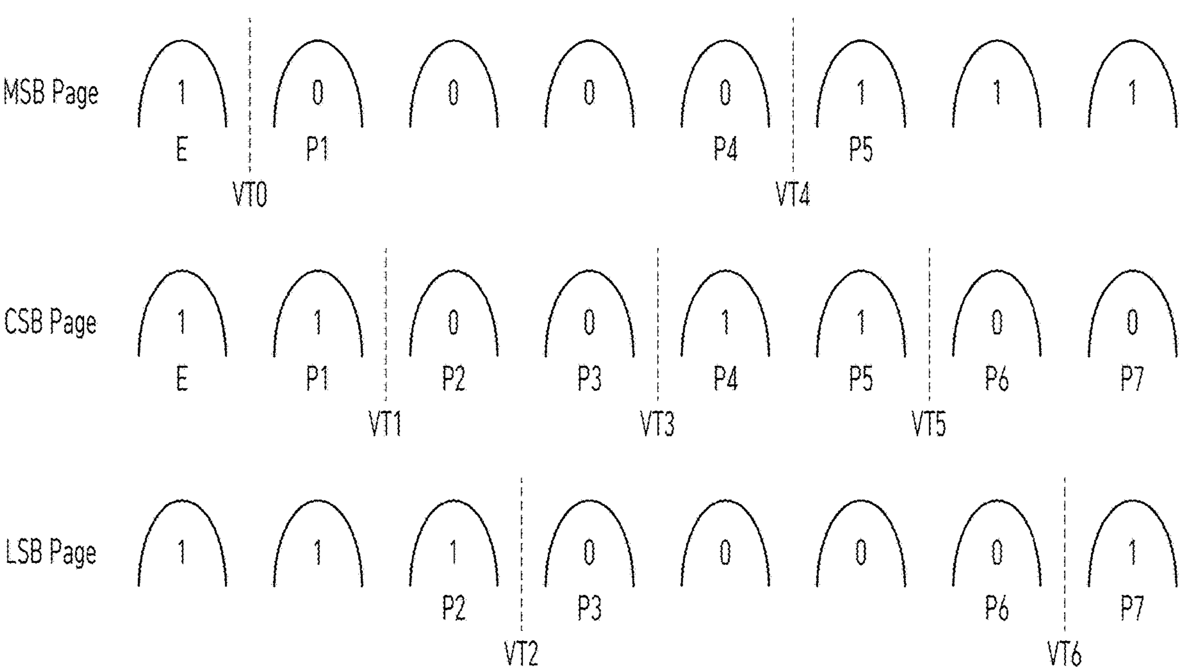
FIG. 4C is a diagram illustrating state distributions for pages of a triple-level cell (TLC) in accordance with another embodiment of the present invention.

In the TLC, as shown in FIG. 4C, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state P1 and a threshold value VT4 that distinguishes between a fourth program state P4 and a fifth program state P5. For a CSB page, 3 thresholds include VT1, VT3 and VT5. VT1 distinguishes between a first program state P1 and a second program state P2. VT3 distinguishes between a third program state P3 and the fourth program state P4. VT5 distinguishes between the fourth program state P5 and the sixth program state P6. For an LSB page, 2 thresholds include VT2 and VT6. VT2 distinguishes between the second program state P2 and the third program state 3. VT6 distinguishes between the sixth program state P6 and a seventh program state P7.

Figure 5:
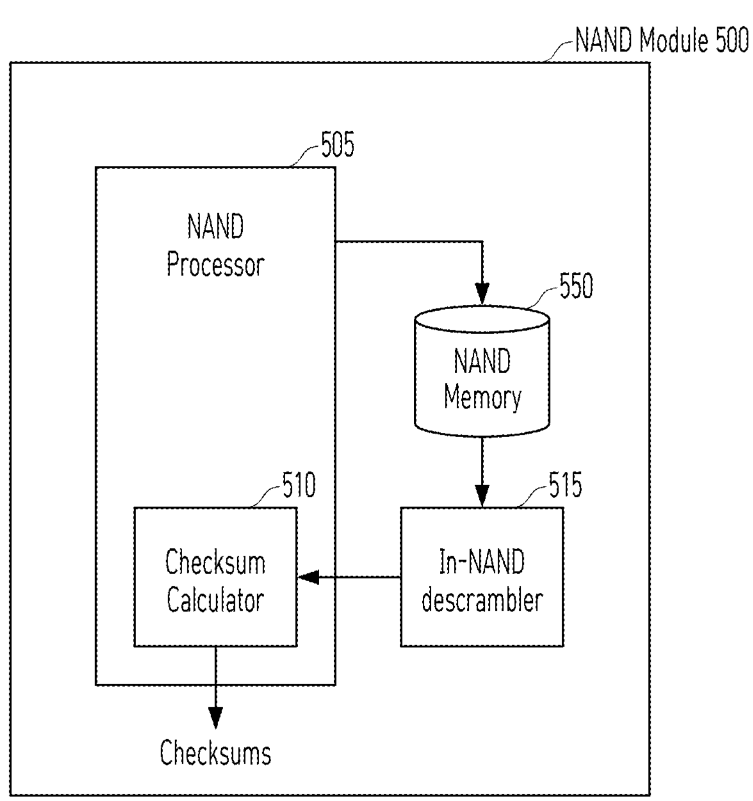
FIG. 5 is a diagram illustrating a storage system in accordance with embodiments of the present invention which includes an in-NAND descrambler.

FIG. 5 is a diagram illustrating a storage system in accordance with embodiments of the present invention. Referring to FIG. 5, the NAND module 500 may include NAND memory 550 as storage and includes therein NAND processor 505 including checksum calculator 510. The NAND processor 505 may perform a read operation on data in NAND memory 550. During the read operation, the data may need to be descrambled to be in the correct format for computing checksum. Then, the checksum calculator 510 is able to compute checksum to estimate RBER.

When the number of the error bits is greater than or equal to a threshold number of correctable error bits, an error correction fail signal may be output, which indicates failure in correcting the error bits. Such failure may require that the information bits from a host will need to be sent again to NAND memory 550. Accordingly, checksum calculator 510 can be used to provide an estimate of the RBER in data to be stored in NAND memory 550.

In various embodiments, the NAND Module 500 shown in FIG. 5 may be implemented using a variety of techniques including an application-specific integrated circuit (ASIC), a field-programmable gate array (FPGA), and/or a general purpose processor (e.g., an Advanced RISC Machine (ARM) core).

Figure 6:
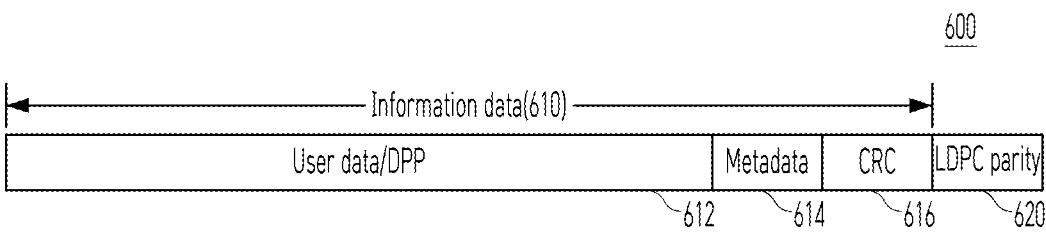
FIG. 6 is a diagram illustrating a format of a codeword to be stored in a storage system in accordance with embodiments of the present invention.

As background, FIG. 6 is a diagram illustrating a format of a codeword 600 to be stored in a storage system. Referring to FIG. 6, the codeword 600 may include information data 610 (information bits or user data) and LDPC parity data 620. In some embodiments, the codeword 600 may be generated by the LDPC codes noted above.

The information data 610 may include user data with data path protection (DPP) 612, meta-data 614 and cyclic redundancy check (CRC) parity bits 616. A CRC code which is an error-detecting code commonly used in digital networks and storage devices may detect accidental changes to raw data.

In a typical LDPC decoder, if the LDPC checksum is zero, the decoding may be terminated. The CRC parity bits 616 will be computed based on the decoded user data 612 and meta-data 614 after the LDPC decoding. If the computed CRC parity bits match the decoded CRC parity bits, decoding may be successful. Otherwise, a mis-correction may be declared.

In order to run these tasks more efficiently, in one embodiment of the present invention, the semiconductor memory device 200 (in FIG. 3) or NAND module 500 (in FIG. 5) may measure the checksum to estimate the number of errors in the stored data. Such an in-NAND module calculating the RBER can improve the performance/power of SSD by eliminating the need to transfer the stored data to the SOC when the RBER is acceptable.

The present invention recognized that, in the SSD quality of service (QoS) requirements for solid state drives such as for example the PCIe Gen 6 enterprise SSD, the latency at a 6-9's percentile is limited to 100 μs. Considering the worst case, latency per read is around 55 μs, this means that all reads must be successfully decoded by the 1st read or 2nd read. A 2nd read is allowed if it succeeds with low latency. There is no chance for a 3rd read up to 6-9's percentile.

The present invention recognized that defense algorithms work in a reactive way, meaning that the read bias setting is not updated until a read failure. This operation further challenges the SoC design, as likely the QoS 6-9's requirement would have to be violated in order to determine better 1st and 2nd read bias settings.

Accordingly, in one embodiment of the present invention, a proactive history read adaptation is utilized without using a test read to determine better 1st and 2nd read bias settings. This proactive history read adaptation scheme provides better QoS and reliability compared to existing defense algorithm techniques.

QoS Requirement

FIG. 7 is a diagram illustrating contemporaneous QoS requirements for solid state drives. More specifically, FIG. 7 shows the QoS requirement of the PCIe Gen 6 enterprise SSD (eSSD) product. For a read command, the worst-case latency is around 50 μs. As apparent, 99.99999% of the read commands need to be successfully decoded with the 1st read. The second read might be allowed if second read can be decoded with lower than a 45 μs latency. A third read is not allowed at 6-9's QoS percentile because the first 2 read failures already consumed 110 μs of latency.

The Gen-6 eSSD QoS requirement shown in FIG. 7 indicates that the defense algorithms for solid state drives such the PCIe Gen 6 enterprise SSD need to focus on the first 2 reads. Any optimization on read retry (RR) after a 2nd read does not provide a meaningful improvement to QoS.

Decodable Region

Figure 8:
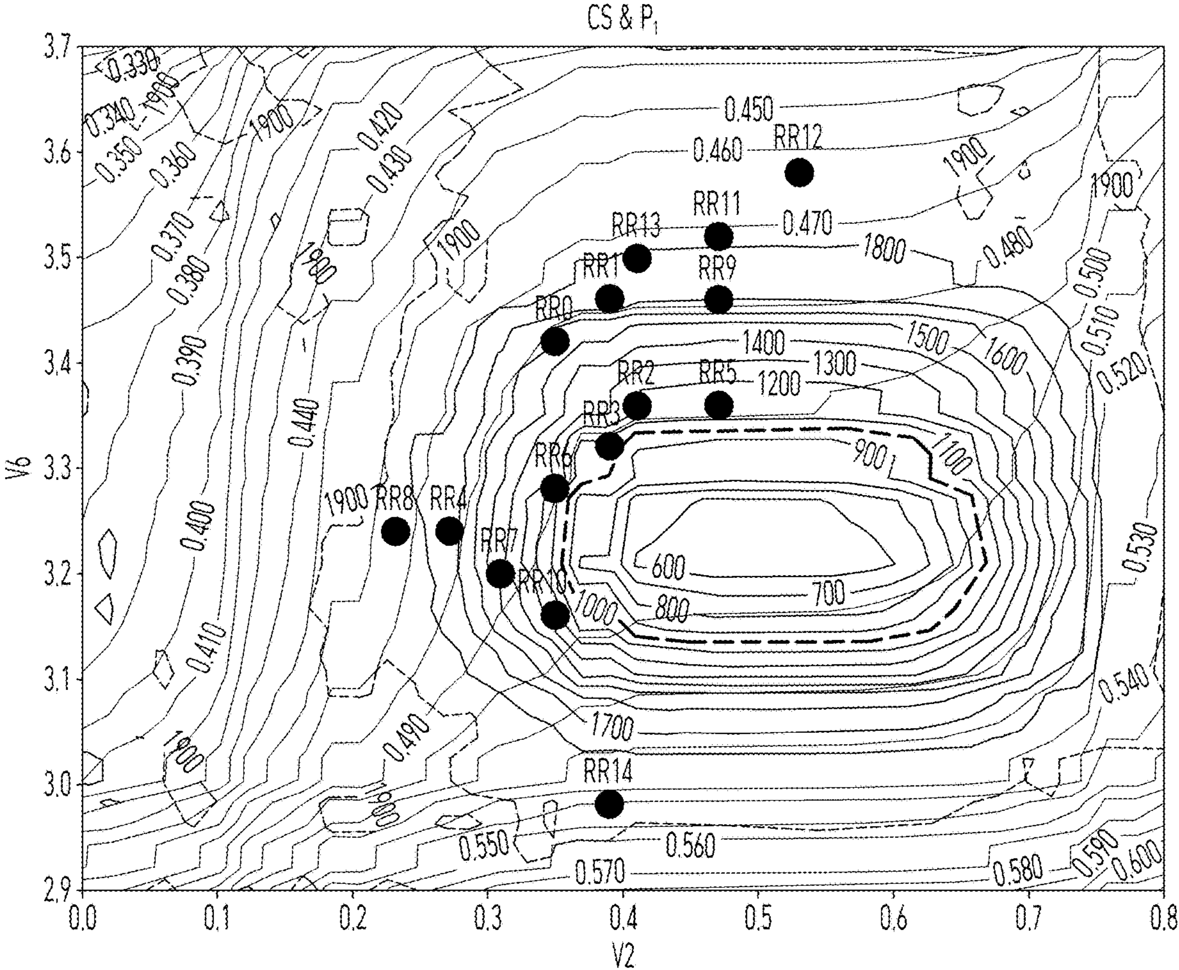
FIG. 8 is a diagram illustrating a decodable region of a least significant bit page.

FIG. 8 is a plot of a decodable region of an LSB Page. The choice of read bias affects the failed bit count (FBC) at a decoder input. In FIG. 8, a plot of a boundary of a decodable region, which is defined as the choices of V2 and V6 (as read biases of LSB page) that give FBCs which are acceptable for ECC correction capability, as the dashed contour line shows. The decodable region roughly spans 0.3V in the V2 dimension (from 0.35V to 0.65V) and spans 0.2V in the V6 dimension (from 3.15V to 3.35V). Considering the 20 mV step size in a NAND device for read bias change, there are around 150 different choices of the combination of V2 and V6 which fall into this decodable region defined by the dashed contour line.

Proactive History Read Adaptation

To prevent read failure, one embodiment of the present invention performs history read bias optimization in a proactive way. The first read bias optimization can be performed using FBC obtained from ECC unit 130 or checksum information obtained from control circuit 220 of FIG. 3.

While test reads could be used, the present invention recognized that test reads can introduce additional traffic and the test reads may collide with host reads and degrade the QoS. The level of QoS impact depends on the collision probability. In one embodiment of the present invention, test reads are not used, although it is possible for a limited number of the test reads could be used.

For those memory blocks that have ongoing host reads, the present invention in one embodiment relies on the host reads to adapt the history read bias to an acceptable bias value where the FBC is acceptable. For the blocks that do not have host reads ongoing or scheduled, the present invention in one embodiment performs in-NAND partial checksum PCS based read bias optimization. There is no collision on the sensing operation between host read and in-NAND PCS calculation, as there are no host reads going to the NAND media.

Adaptation Policy with Host Reads

In a memory block that has ongoing host read traffic, instead of using test reads, the host reads are used to adapt the read bias as history read. Instead of using only 1 read retry (RR) entry as a history read, the present invention in one embodiment utilizes multiple RRs as multiple history read biases such as for example 3 RRs, denoted as history-read-0 (HR0), history-read-1 (HR1) and history-read-2 (HR2).

In one embodiment, history reads HR0, HR1 and HR2 are close to each other in terms of the Euclidian distance of the voltage thresholds Vth (for example the Vth shown in FIG. 4C as VT0, VT1, VT2, VT3, VT4, VT5, and VT6). The history reads can be recorded per die, or per block or per WL group, depending on any tradeoffs between complexity/memory footprint and accuracy. In one embodiment, performance of the multiple history reads such as HR0, HR1 and HR2 can be randomly selected or selected in a deterministic way, such as round-robin so that each entry gets equal chance of usage.

Host reads can provide accurate FBC information once successfully decoded. When any of the 3 HR entries has a FBC higher than a certain threshold, for example 70% of the ECC correction capability, the worst HR is ejected and a new HR is inserted to the 3 HR entries. This ejection and insertion can occur at a low frequency, for example once every 1 hour, so that there is less burden to the CPUs running the algorithm.

One exemplary way to find a HR entry for insertion is described as follows.

This HR entry search problem can be viewed as a numerical gradient calculation problem. Assume the last FBC from HR0, HR1 and HR2 are FBC0, FBC1, and FBC2. More specifically, assuming the LSB page has two read threshold levels (V2, V6) and that three different history reads (HR0, HR1, HR2) are tracked, for each HRi, i∈{0,1,2}, with the stored read threshold levels (V2i, V6i) and with the corresponding fail-bit count being FBCi, then, the numerical gradients dFBC/dV2, dFBC/dV6 can be calculated as:

$$dFBC/dV2=\{(FBC0-FBC1)/(V20-V21)+(FBC1-FBC2)/(V21-V22)+(FBC2-FBC0)/(V22-V20)\}/3,$$

where FBC0, FBC1, FBC2 are the failed-bit counts at V20, V21, and V22 (which are voltages offset from voltage threshold V2), and $$dFBC/dV6=\{(FBC0'-FBC1')/(V60-V61)+(FBC1'-FBC2')/(V61-V62)+(FBC2'-FBC0)/(V62-V60)\}/3,$$

where FBC0', FBC1', FBC2' are the failed-bit counts at V60, V61, and V62 (which are voltages offset from voltage threshold V6). That is, in one embodiment, the numerical gradients are calculated from differences in failed bit counts for data read at respective voltages offset from voltage thresholds V2 and V6.

In one embodiment of the invention, after calculating the numerical gradients, the new entry, that is the voltage threshold level (V2*, V6*), is obtained as follows:

(V2*, V6*)=(V2k−delta*dFBC/dV2, V6k−delta*dFBC/dV6), where (V2k, V6k) belongs to the HR with the highest FBC among HR0, HR1, HR2, where the hyper-parameter (i.e., delta) is the stepping size for gradient descent algorithm and can be set for example during implementation and/or optimization of the operation of ECC unit 130 or control circuit 220.

Adaptation Policy without Host Reads

In a NAND memory block area that has no ongoing host read commands, there is no trigger of HR entries and no FBC information is available for adaptation. The underlying programing voltage (PV) distribution may still shift along time and leads to retention related issues. In this case, according to different embodiments of the present invention, the schemes can help mitigate retention related concerns.

A counter per block can be used to track retention time. When the retention time is longer than a preset time (for example longer than a maximum allowed time), the block will be reclaimed.

Test reads can be used together with the proactive history read adaptation scheme to adapt HR entries per block. In-NAND checksum calculations can be used without test reads to estimate FBC and to update the HR entries.

Computerized Method

Figure 9:
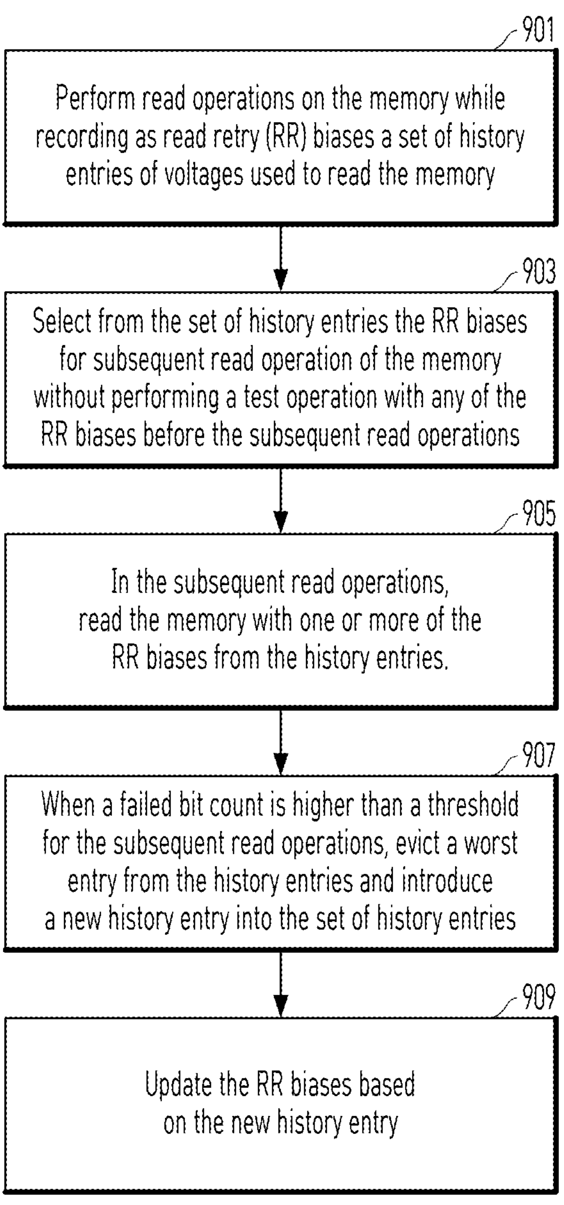
FIG. 9 is a flowchart illustrating one method for reading data from storage in accordance with embodiments of the present invention.

In one embodiment of the present invention, there is provided a method (as depicted in FIG. 9) for reading data from memory. This method may be implemented in ECC unit 130 or control circuit 220 of FIG. 2. In this method at 901, performs read operations on the memory while recording as read retry (RR) biases a set of history entries of voltages used to read the memory. At 903, this method selects from the set of history entries the RR biases for subsequent read operation of the memory without performing a test operation with any of the RR biases before the subsequent read operations. At 905, in the subsequent read operations, this method reads the memory with one or more of the RR biases from the history entries. At 907, when a failed bit count is higher than a threshold for the subsequent read operations, this method evicts a worst entry from the history entries and introducing a new history entry into the set of history entries. At 909, this method updates the RR biases based on the new history entry and excluding the worst entry.

In one embodiment, this method further comprises recording the set of history reads per die, or per block, or per WL group.

In one embodiment, this method further comprises randomly selecting the RR biases from the set of history reads to read the memory in the subsequent read operations.

In one embodiment, this method further comprises selecting the RR biases from the set of history reads used to read the memory in the subsequent read operations such that each of the RR biases has an equal chance of usage.

In one embodiment, this method further comprises determining the new history entry based a gradient of differences between voltage thresholds used to read a page of the memory for the history entry having a lowest failed bit count (FBC).

In one embodiment of this method, the memory comprises a triple level cell (TLC), and the voltage thresholds are voltages associated with reading one or more of a most significant bit page, a center significant bit page, and a least significant bit page.

In one embodiment of this method, the voltage thresholds are voltages V2, V6 for reading the least significant bit page.

In one embodiment of this method, the new history entry is determined as (V2−delta*dFBC/dV2,V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

In one embodiment of this method, the numerical gradients are calculated from differences in failed bit counts for data read at respective voltages offset from voltage thresholds V2 and V6.

In one embodiment, this method further comprises performing the test operation with one or more the RR biases after the updating of the RR biases and adjust the voltages in the set of the history entries.

Figure 10:
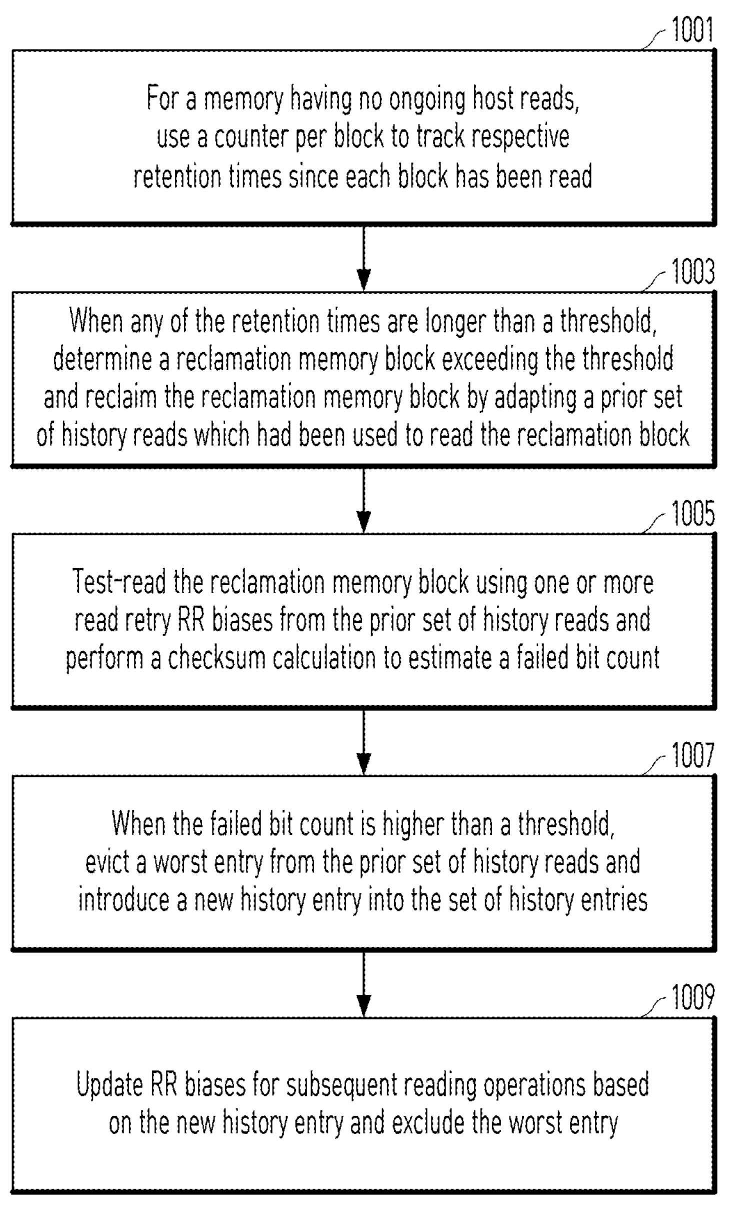
FIG. 10 is a flowchart illustrating a method for updating read retry biases in accordance with embodiments of the present invention.

In another embodiment of the present invention, there is provided a method (as depicted in FIG. 10) for reading data from memory. This method may be implemented in ECC unit 130 or control circuit 220 of FIG. 2. This method (referred to below for the purpose of identification not limitation as the non-host read method) at 1001, for a memory having no ongoing host reads, uses a counter per block to track respective retention times since each block has been read. At 1003, when any of the retention times are longer than a threshold, this method determines a reclamation memory block exceeding the threshold and reclaim the reclamation memory block by adapting a prior set of history reads which had been used to read the reclamation block. At 1005, this method test-reads the reclamation memory block using one or more read retry RR biases from the history reads and performs a checksum calculation to estimate a failed bit count. At 1007, when the failed bit count is higher than a threshold, this method evicts a worst entry from the prior set of history reads and introduces a new history entry into the set of history entries. At 1009, this method updates the RR biases for subsequent reading operation based on the prior set of history reads excluding the worst entry and the new history entry.

This non-host read method described above can utilize any of the operations described above with FIG. 9.

In one embodiment, the non-host read method further comprises forming the prior set of history reads by recording biases for reads per die, or for per block, or for per WL group.

In one embodiment, the non-host read method further comprises randomly selecting the RR biases from the prior set of history reads to read the memory in the subsequent read operations.

In one embodiment, the non-host read method further comprises selecting the RR biases from the set of history reads used to read the memory in the subsequent read operations such that each of the RR biases has an equal chance of usage.

In one embodiment, the non-host read method further comprises determining the new history entry based a gradient of differences between voltage thresholds used to read a page of the memory for the history entry having a lowest failed bit count (FBC).

In one embodiment of the non-host read method, the memory comprises a triple level cell (TLC), and the voltage thresholds are voltages associated with reading one or more of a most significant bit page, a center significant bit page, and a least significant bit page.

In one embodiment of the non-host read method, the voltage thresholds are voltages V2, V6 for reading the least significant bit page.

In one embodiment of this method, the new history entry is determined as (V2−delta*dFBC/dV2,V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

In one embodiment of the non-host read method, the numerical gradients are calculated from differences in failed bit counts for data read at respective voltages offset from voltage thresholds V2 and V6.

In one embodiment, the non-host read method further comprises performing the test operation with one or more the RR biases after the updating of the RR biases and adjust the voltages in the set of the history entries.

Figure 11:
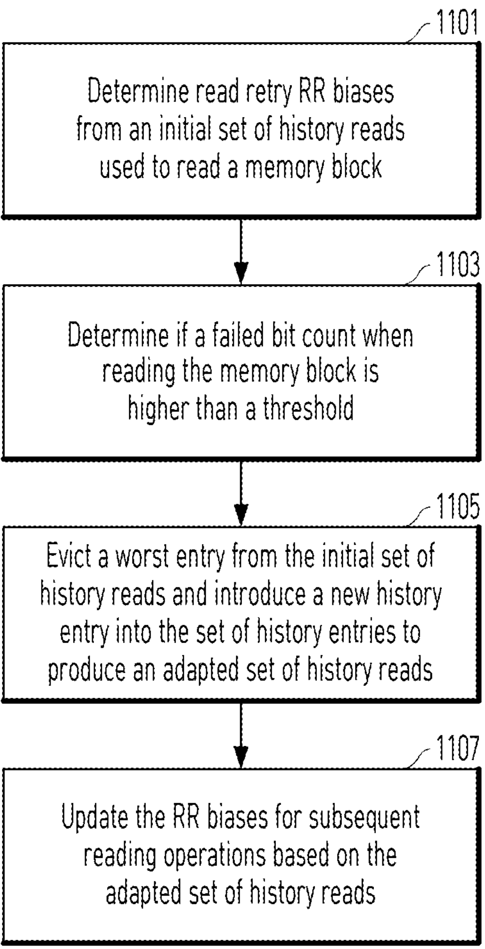
FIG. 11 is a flowchart illustrating another method for updating read retry biases in accordance with embodiments of the present invention.

In still another embodiment of the present invention, there is provided a method (as depicted in FIG. 11) for reading data from memory. This method may be implemented in ECC unit 130 or control circuit 220 of FIG. 2. This method (referred to below for the purpose of identification not limitation as the history adaptation read method), at 110, determines read retry RR biases from an initial set of history reads used to read a memory. At 1103, this method determines if a failed bit count when reading the memory is higher than a threshold. At 1105, this method evicts a worst entry from the initial set of history reads and introduces a new history entry into the set of history entries to produce an adapted set of history reads. At 1107, this method updates the RR biases for subsequent reading operations based on the adapted set of history reads.

This history adaptation read method described above can utilize any of the operations described above with FIG. 9.

In one embodiment, the history adaptation read method further comprises forming the initial set of history reads by recording biases for reads per die, or for per block, or for per WL group.

In one embodiment, the history adaptation read method further comprises randomly selecting the RR biases from the initial set of history reads to read the memory in the subsequent read operations.

In one embodiment, the history adaptation read method further comprises selecting the RR biases from the initial set of history reads used to read the memory in the subsequent read operations such that each of the RR biases has an equal chance of usage.

In one embodiment, the history adaptation read method further comprises determining the new history entry based a gradient of differences between voltage thresholds used to read a page of the memory for the history entry having a lowest failed bit count (FBC).

In one embodiment of the history adaptation read method, the memory comprises a triple level cell (TLC), and the voltage thresholds are voltages associated with reading one or more of a most significant bit page, a center significant bit page, and a least significant bit page.

In one embodiment of the history adaptation read method, the voltage thresholds are voltages V2, V6 for reading the least significant bit page.

In one embodiment of this method, the new history entry is determined as (V2−delta*dFBC/dV2, V6−delta*dFBC/dV6), where dFBC is difference in the FBCs between data read with V2 and V6, and delta is a constant. where dFBC/dV2 and dFBC/dV6 are numerical gradients in failed bit counts (FBCs) at the voltage thresholds V2 and V6, and delta is a constant defining a stepping size of the gradients.

In one embodiment of the history adaptation read method, the numerical gradients are calculated from differences in failed bit counts for data read at respective voltages offset from voltage thresholds V2 and V6.

In one embodiment, the history adaptation read method further comprises performing the test operation with one or more the RR biases after the updating of the RR biases and adjust the voltages in the set of the history entries.

Memory System

In another embodiment of the present invention, there is provided a memory system (such as in FIG. 3) having a memory; a controller coupled to the memory and configured to read data from the memory. The controller is configured to: perform read operations on the memory while recording as read retry (RR) biases a set of history entries of voltages used to read the memory; select from the set of history entries the RR biases for subsequent read operation of the memory without performing a test operation with any of the RR biases before the subsequent read operations; in the subsequent read operations, read the memory with one or more of the RR biases from the history entries; when a failed bit count is higher than a threshold for the subsequent read operations, evict a worst entry from the history entries and introduce a new history entry into the set of history entries; and update the RR biases based on the new history entry.

In one embodiment of the memory system, the controller is configured to record the set of history reads per die, or per block, or per WL group.

In one embodiment of the memory system, the controller is configured to randomly select the RR biases from the set of history reads to read the memory in the subsequent read operations.

In one embodiment of the memory system, the controller is configured to select the RR biases from the set of history reads used to read the memory in the subsequent read operations such that each of the RR biases has an equal chance of usage.

In one embodiment of the memory system, the controller is configured to determine the new history entry based a gradient of differences between voltage thresholds used to read a page of the memory for the history entry having a lowest failed bit count (FBC).

In one embodiment of the memory system, the memory comprises a triple level cell (TLC), and a least significant bit, and the voltage thresholds are voltages associated with reading one or more of a most significant bit page, a center significant bit page, and a least significant bit page.

In one embodiment of the memory system, the voltage thresholds are voltages V2, V6 for reading the least significant bit page.

In one embodiment of the memory system, the controller is configured to determine the new history entry as (V2−delta*dFBC/dV2, V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

In one embodiment of the memory system, the controller is configured to calculate the numerical gradients from differences in the failed bit counts for data read at respective voltages offset from voltage thresholds V2 and V6.

In one embodiment of the memory system, the controller is configured to perform the test operation with one or more the RR biases after the updating of the RR biases and adjust the voltages in the set of the history entries.

In a different embodiment of the present invention, there is provided a memory system (such as in FIG. 3) having a memory; a controller coupled to the memory and configured to read data from the memory. The controller is configured to, when there are no ongoing host reads, use a counter per block to track respective retention times since each block has been read. (This embodiment is referred to below for the purpose of identification not limitation as the non-host read embodiment) The controller is configured to a) when any of the retention times are longer than a threshold, determine a reclamation block exceeding the threshold and reclaim the reclamation block by adapting a prior set of history reads which had been used to read the reclamation block, b) test read the reclamation block with entries with one or more read retry RR biases from the history reads and perform a checksum calculation to estimate a failed bit count, c) when the failed bit count is higher than a threshold, evict a worst entry from the prior set of history reads and introduce a new history entry into the set of history entries, and d) update the RR biases for subsequent reading operations based on the new history entry and excluding the worst entry.

In this non-host read embodiment of the memory system, the controller is configured to determine the prior set of history reads by record biases for reads per die, or for per block, or for per WL group.

In this non-host read embodiment, the controller is configured to randomly select the RR biases from the set of history reads to read the memory in the subsequent read operations.

In this non-host read embodiment, the controller is configured to select the RR biases from the set of history reads used to read the memory in the subsequent read operations such that each of the RR biases has an equal chance of usage.

In this non-host read embodiment, the controller is configured to determine the new history entry based a gradient of differences between voltage thresholds used to read a page of the memory for the history entry having a lowest failed bit count (FBC).

In this non-host read embodiment, the memory comprises a triple level cell (TLC), and the voltage thresholds are voltages associated with reading one or more of a most significant bit page, a center significant bit page, and a least significant bit page.

In this non-host read embodiment, the voltage thresholds are voltages V2, V6 for reading the least significant bit page.

In this non-host read embodiment, the controller is configured to determine the new history entry as (V2−delta*dFBC/dV2, V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients. In this non-host read embodiment, the controller is configured to calculate the numerical gradients from differences in the failed bit counts for data read at respective voltages offset from voltage thresholds V2 and V6.

In this non-host read embodiment, the controller is configured to perform the test operation with one or more the RR biases after the updating of the RR biases and adjust the voltages in the set of the history entries.

In still another embodiment of the present invention, there is provided a memory system (such as in FIG. 3) having a memory; a controller coupled to the memory and configured to read data from the memory. (This embodiment is referred to below for the purpose of identification not limitation as the history adaptation read embodiment). The controller is configured to determine read retry RR biases from an initial set of history reads used to read a memory block, determine if a failed bit count when reading the memory block is higher than a threshold, evict a worst entry from the initial set of history reads and introduce a new history entry into the set of history entries to produce an adapted set of history reads, and update the RR biases for subsequent reading operations based on the adapted set of history reads.

In this history adaptation read embodiment of the memory system, the controller is configured to determine the prior set of history reads by record biases for reads per die, or for per block, or for per WL group.

In this history adaptation read embodiment, the controller is configured to randomly select the RR biases from the set of history reads to read the memory in the subsequent read operations.

In this history adaptation read embodiment, the controller is configured to select the RR biases from the set of history reads used to read the memory in the subsequent read operations such that each of the RR biases has an equal chance of usage.

In this history adaptation read embodiment, the controller is configured to determine the new history entry based a gradient of differences between voltage thresholds used to read a page of the memory for the history entry having a lowest failed bit count (FBC).

In this history adaptation read embodiment, the memory comprises a triple level cell (TLC), and the voltage thresholds are voltages associated with reading one or more of a most significant bit page, a center significant bit page, and a least significant bit page.

In this history adaptation read embodiment, the voltage thresholds are voltages V2, V6 for reading the least significant bit page.

In this history adaptation read embodiment, the controller is configured to determine the new history entry as (V2−delta*dFBC/dV2, V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

In this history adaptation read embodiment, the controller is configured to calculate the numerical gradients from differences in the failed bit counts for data read at respective voltages offset from voltage thresholds V2 and V6.

In this history adaptation read embodiment, the controller is configured to perform the test operation with one or more the RR biases after the updating of the RR biases and adjust the voltages in the set of the history entries.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for reading data from memory, comprising:

performing read operations on the memory while recording as read retry (RR) biases a set of history entries of voltages used to read the memory;

selecting from the set of history entries the RR biases for subsequent read operations of the memory without performing a test operation with any of the RR biases before the subsequent read operations;

in the subsequent read operations, reading the memory with one or more of the RR biases from the history entries;

when a failed bit count is higher than a threshold for the subsequent read operations, evicting a worst entry based on the failed bit count from the history entries and introducing a new history entry into the set of history entries; and updating the RR biases based on the new history entry.

2. The method of claim 1, further comprising recording the set of history reads per die, or per block, or per word line group.

3. The method of claim 1, further comprising randomly selecting the RR biases from the set of history reads to read the memory in the subsequent read operations.

4. The method of claim 1, further comprising selecting the RR biases from the set of history reads used to read the memory in the subsequent read operations such that each of the RR biases has an equal chance of usage.

5. The method of claim 1, further comprising determining the new history entry based on a gradient of differences between voltage thresholds used to read a page of the memory for the history entry having a lowest failed bit count (FBC).

6. The method of claim 5, wherein the memory comprises a triple level cell (TLC), and the voltage thresholds are voltages associated with reading one or more of a most significant bit page, a center significant bit page, and a least significant bit page.

7. The method of claim 6, wherein the voltage thresholds are voltages V2, V6 for reading the least significant bit page.

8. The method of claim 7, further comprising determining the new history entry as (V2−delta*dFBC/dV2, V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

9. The method of claim 8, wherein the numerical gradients are calculated from differences in failed bit counts for data read at respective voltages offset from voltage thresholds V2 and V6.

10. The method of claim 5, further comprising performing the test operation of one or more the RR biases after the updating of the RR biases to adjust the voltages in the set of the history entries.

11. A memory system, comprising:

a memory;

a controller coupled to the memory and configured to read data from the memory, wherein the controller is configured to:

perform read operations on the memory while recording as read retry (RR) biases a set of history entries of voltages used to read the memory;

select from the set of history entries the RR biases for subsequent read operations of the memory without performing a test operation with any of the RR biases before the subsequent read operations;

in the subsequent read operations, read the memory with one or more of the RR biases from the history entries;

when a failed bit count is higher than a threshold for the subsequent read operations, evict a worst entry based on the failed bit count from the history entries and introduce a new history entry into the set of history entries; and update the RR biases based on the new history entry.

12. The memory system of claim 11, wherein the controller is configured to record the set of history reads per die, or per block, or per word line group.

13. The memory system of claim 11, wherein the controller is configured to randomly select the RR biases from the set of history reads to read the memory in the subsequent read operations.

14. The memory system of claim 11, wherein the controller is configured to select the RR biases from the set of history reads used to read the memory in the subsequent read operations such that each of the RR biases has an equal chance of usage.

15. The memory system of claim 11, wherein the controller is configured to determine the new history entry based on a gradient of differences between voltage thresholds used to read a page of the memory for the history entry having a lowest failed bit count (FBC).

16. The memory system of claim 15, wherein the memory comprises a triple level cell (TLC), and the voltage thresholds are voltages associated with reading one or more of a most significant bit page, a center significant bit page, and a least significant bit page.

17. The memory system of claim 16, wherein the voltage thresholds are voltages V2, V6 for reading the least significant bit page.

18. The memory system of claim 17, wherein the new history entry is determined as (V2−delta*dFBC/dV2, V6−delta*dFBC/dV6), where dFBC/dV2 and dFBC/dV6 are numerical gradients in failed bit counts (FBCs) at the voltage thresholds V2 and V6, and delta is a constant defining a stepping size of the gradients.

19. The memory system of claim 18, wherein the controller is configured to calculate the numerical gradients from differences in failed bit counts for data read at respective voltages offset from voltage thresholds V2 and V6.

20. The memory system of claim 19, wherein the controller is configured to perform the test operation of one or more the RR biases after the updating of the RR biases to adjust the voltages in the set of the history entries.

* * * * *